United States Patent
Ichizaki (10) Patent No.: US 6,875,275 B1
(45) Date of Patent: Apr. 5, 2005

(54) PRODUCTION APPARATUS FOR PRODUCING A CRYSTAL

(75) Inventor: Toshio Ichizaki, Ibaraki-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/048,795

(22) Filed: Mar. 27, 1998

(30) Foreign Application Priority Data

Mar. 31, 1997 (JP) .............................. 9/081624
Feb. 27, 1998 (JP) .......................... 10/063952

(51) Int. Cl.$^7$ .............................. C30B 35/00
(52) U.S. Cl. .................. 117/200; 117/204; 117/223; 117/940
(58) Field of Search ................ 117/200, 204, 117/223, 940

(56) References Cited

U.S. PATENT DOCUMENTS

| | | | | |
|---|---|---|---|---|
| 2,214,976 A | | 9/1940 | Stockbarger ................. 23/273 |
| 4,030,965 A | * | 6/1977 | Hammond et al. ..... 156/616 R |
| 4,032,313 A | * | 6/1977 | Tokuhara ......................... 65/1 |
| 4,076,574 A | * | 2/1978 | Pastor et al. ............ 156/616 R |
| 4,379,733 A | * | 4/1983 | Pastor et al. ............ 156/616 R |
| 4,649,002 A | * | 3/1987 | Kim et al. ..................... 264/58 |
| 4,818,282 A | * | 4/1989 | Wanetzky et al. ............. 75/63 |

FOREIGN PATENT DOCUMENTS

| | | | |
|---|---|---|---|
| JP | 61-44792 | 3/1986 | |
| JP | 4349198 | 12/1992 | |
| JP | 4-349198 | 12/1992 | ........... C30B/29/12 |
| JP | 4349199 | 12/1992 | |
| JP | 4-349199 | 12/1992 | ........... C30B/29/12 |

OTHER PUBLICATIONS

V.N. Cheredov, "Contaminant Color Centers in Synthetic Crystals of Calcium Fluoride", Inorganic Material, vol. 28, No. 3. 1992 (Russian Pulication).*

V.N. Cheredov, "Contaminant Color Centers In Synthetic Crystals of Calcium Fluoride", Inorganic Material, vol. 28, No. 3, 1992 (Russian/Publications); no English translation available.

* cited by examiner

*Primary Examiner*—Nadine G. Norton
*Assistant Examiner*—Matthew Anderson
(74) *Attorney, Agent, or Firm*—Fitzpatrick, Cella, Harper & Scinto (57) ABSTRACT

A production apparatus for producing a crystal includes a crucible divided into a plurality of stages, each stage containing a crystal precursor material, and a heater arranged to heat the crucible. The crucible has formed therein a degassing hole in a side wall portion thereof for discharging an impurity gas produced when refining the crystal precursor material by adding a scavenger thereto, and a lower portion of a first stage of the plurality of stages is positioned to cover an upper edge of a wall portion of a second stage of the plurality of stages. The overall height of the plurality of stages is 10 mm to 50 mm, the degassing hole has a diameter of 1 mm to 5 mm, and a fluoride crystal is formed from the crystal precursor material.

16 Claims, 11 Drawing Sheets

PRODUCTION APPARATUS FOR PRODUCING A CRYSTAL

BACKGROUND OF THE INVENTION

1. Field of the Invention

The present invention relates to a production apparatus for a fluoride crystal preferable for various kinds of optical elements, lenses, window materials, prisms, and the like to be used in a wide wavelength range from a vacuum ultraviolet region to a far-infrared region, and in particular, to a production apparatus for a fluoride crystal to be used for an optical material such as a large aperture lens (aperture of 250 mm or more) for an excimer laser.

2. Description of the Related Art

An excimer laser attracts attention as the only high-output laser that oscillates outside the ultraviolet region, so that widespread application thereof is expected in the electronics industry, chemical industry, and energy industry.

Specifically, the excimer laser is used in processing metal, resin, glass, ceramics and semiconductors, and in chemical reactions.

An apparatus for generating an exciser laser beam is known as an excimer laser oscillating apparatus. A laser gas filling a chamber, such as Ar, Kr, Xe, $F_2$ or $Cl_2$ is excited by electron beam radiation or by electric discharge. The excited atoms bond with atoms in the ground state so as to produce molecules-capable of existing only in the excited state. These molecules are the so-called "excimer". Due to its instability, the excimer immediately discharges an ultraviolet ray and falls into the ground state. This phenomenon is called the bond free transition. An apparatus for taking out a laser beam by amplifying the ultraviolet ray obtained by this transition in an optical resonator comprising a pair of mirrors, is an excimer oscillating appartus.

Among excimer laser beams, a KrF laser and an ArF laser have a wavelength of 248 nm and 193 nm, respectively, in a vacuum ultraviolet ray region so that an optical system having a high transmissivity with respect to the wavelength region needs to be used. Examples of glass materials preferably used in the optical system include fluorides, such as calcium fluoride, magnesium fluoride, barium fluoride, neodymium fluoride, lithium fluoride, and lanthanum fluoride.

Hereinafter a conventional production method for a fluoride crystal will be explained with reference to an example of calcium fluoride called fluorite, which can be represented by the stoichiometric ratio of $CaF_2$.

As conventional production methods for a fluoride crystal, methods disclosed in the official gasettes of Japanese Patent Laid-Open Nos. 4-349199 and 4-349198 can be presented. In short, in order to prevent the loss of weight in directly melting a high purity powdery material produced by chemical synthesis due to the bulk specific gravity, the high purity material in a cullet state is used, and is placed in a crystal growth furnace. Now the knowledge obtained by the present inventor to lead to the present invention will be described.

Figure 11:
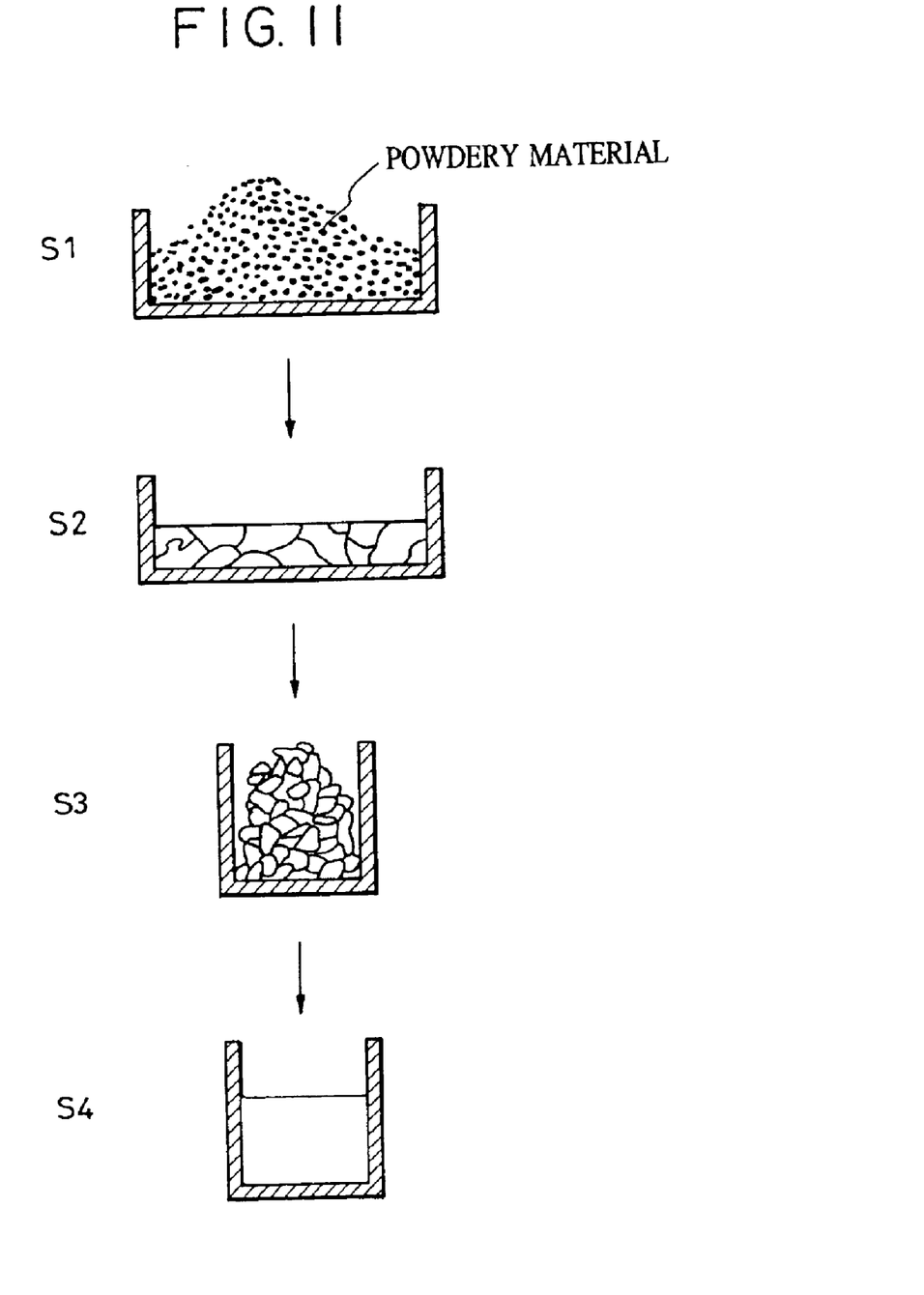
FIG. 11 is a schematic diagram showing a conventional fluorite production process in four steps S1, S2, S3, and S4.

FIG. 11 is a schematic diagram showing a production method for a fluoride crystal initially conducted by the present inventor.

In the process S1, a powdery material is prepared. In the process S2, the material is placed in a container, melted, and then cooled. In the process S3, solidified agglomerates are pulverized with a stainless steel pulverizer. In the post-process S4, a fluorite block is produced by melting and gradually cooling the pulverized agglomerates placed in a crucible for crystal growth.

The process S2 is conducted for reducing the bulk specific density change before and after melting in the process S4, and further, for eliminating impurities from the material.

In the processes S2 and S4, a scavenger, which is a fluoride of a metal, is added in order to eliminate CaO produced by the reaction between the material ($CaF_2$) and water, and the like, or impurities originally existing in the material. For example, a $ZnF_2$ scavenger reacts with CaO to produce ZnO, and is eliminated at the time of melting the crystals. As a result, the CaO impurities are eliminated, so that a fluoride crystal having an excellent transmissivity characteristic can be obtained.

The fluoride crystal block accordingly obtained is cut in a desired thickness, processed and shaped into a desired lens shape to be used as an optical material.

In the discussion of the production conditions for obtaining a fluoride crystal having a still higher transmissivity by the present inventor, it was learned that the crucible structure exerted a great influence on the optical characteristics of the crystal after growth.

That is, in the study on the relationship between the conventional crucible structure to be used in the refining process and the transmissivity of the crystal that is finally obtained, it was learned that although the amount is slight, impurities in a material and a reaction product of a scavenger therewith cannot be wholly eliminated to the outside but in some amount remain inside the crucible, depending on crucible shape. The impurities deteriorate the optical characteristics of the final crystal, and generate irregularity in the optical parts made from that crystal.

In the crystal growth process, a refined block needs to be pulverized and placed in a crucible. However, since the bulk density is lowered by the pulverization, a larger crucible is required for obtaining a given desired crystal. Furthermore, due to the necessity of the pulverizing process, the productivity becomes poor. Moreover, a problem is involved in that a minute amount of impurities included at the time of the pulverization deteriorates the transmissivity of the crystal.

The present invention has been completed based on the foregoing knowledge obtained by elaborate study, and on still further elaborate study directed to the solution of the described problems. An object of the present invention is to provide a production apparatus for a fluoride crystal capable of producing a fluoride crystal having a high transmissivity, and efficiently eliminating such amounts of impurities and of scavenger materials remaining in the crystal.

Another object for the present invention is to provide a production apparatus of a fluoride crystal with a high productivity.

SUMMARY OF THE INVENTION

In order to solve the above-mentioned problems, the below-mentioned inventions are provided.

A first aspect of the present invention is a production apparatus for a fluoride crystal having a crucible divided into multi-stages, to be used for refining a material in a process for refining the material by adding a scavenger in the material.

A second aspect of the present invention is a production apparatus for a fluoride crystal having a degassing hole on a side wall portion of the crucible.

A third aspect of the present invention is a crucible having at least two degassing holes on a side wall portion.

A fourth aspect of the present invention is a crucible having a connecting hole in the bottom center portion, and having at least two degassing holes on the side wall portion.

A fifth aspect of the present invention is such a crucible with the degassing holes having a diameter of 1 to 5 mm.

A sixth aspect of the present invention is such a crucible with the connecting hole having a diameter of 1 to 5 mm.

A seventh aspect of the present invention is such a crucible with the area of the degassing holes smaller than the area of the connecting hole.

An eighth aspect of the present invention is such a crucible with the degassing holes point symmetric with respect to the central axis of the crucible.

A ninth aspect of the present invention is such a crucible having a cylindrical shape with the bottom face.

A tenth aspect of the present invention is such a crucible having a 250 mm or more inner diameter.

An eleventh aspect of the present invention is a crucible having a region for mounting a material.

A twelfth aspect of the present invention is a multi-stage crucible having a region obtained by superimposing a plurality of crucibles to be used as the region for mounting a material, and having a crucible without a connecting hole at the lowermost stage.

A thirteenth aspect of the present invention is a crystal production method for producing a calcium fluoride crystal using this crucible.

A fourteenth aspect of the present invention is a crystal production apparatus having this crucible.

A fifteenth aspect of the present invention is a crystal production apparatus having described multi-stage crucible.

A sixteenth aspect of the present invention is a crucible having a plurality of such crucibles superimposed in multi-stages via a gap for a gas passage.

BRIEF DESCRIPTION OF THE DRAWINGS

FIG. 1, consisting of FIGS. 1A and 1B, are schematic cross-sectional views showing an embodiment of a crucible to be used in a refining furnace of a production apparatus of a fluoride crystal of the present invention.

FIG. 4, consisting of FIGS. 4A and 4B, and 4C, are schematic cross-sectional views showing an embodiment of a growth furnace crucible preferably used in the present invention.

FIG. 10, consisting of FIGS. 10A and 10B are schematic diagrams of an excimer laser oscillator using optical parts made according to the present.

DESCRIPTION OF THE PREFERRED EMBODIMENTS

Figure 1A:
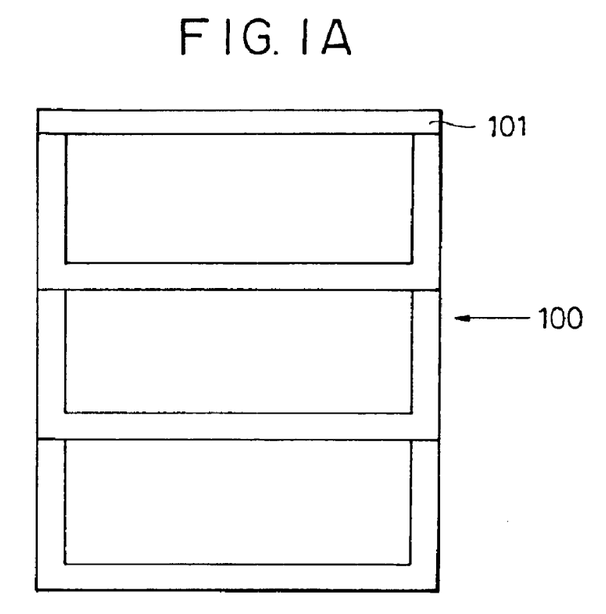
Figure 1B:
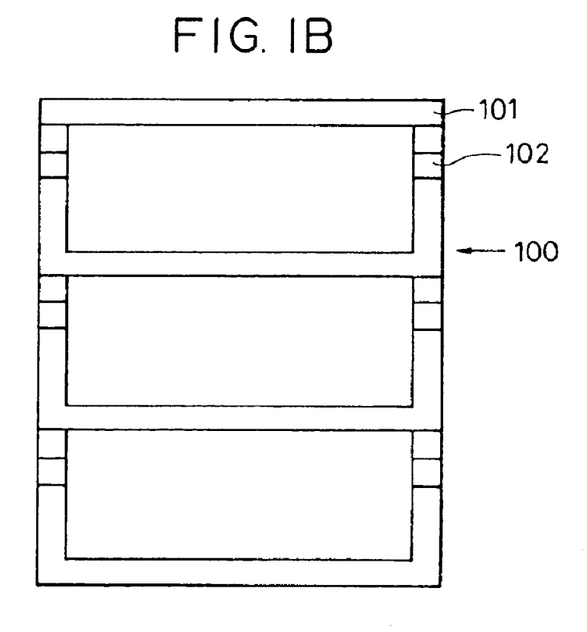
Figure 2:
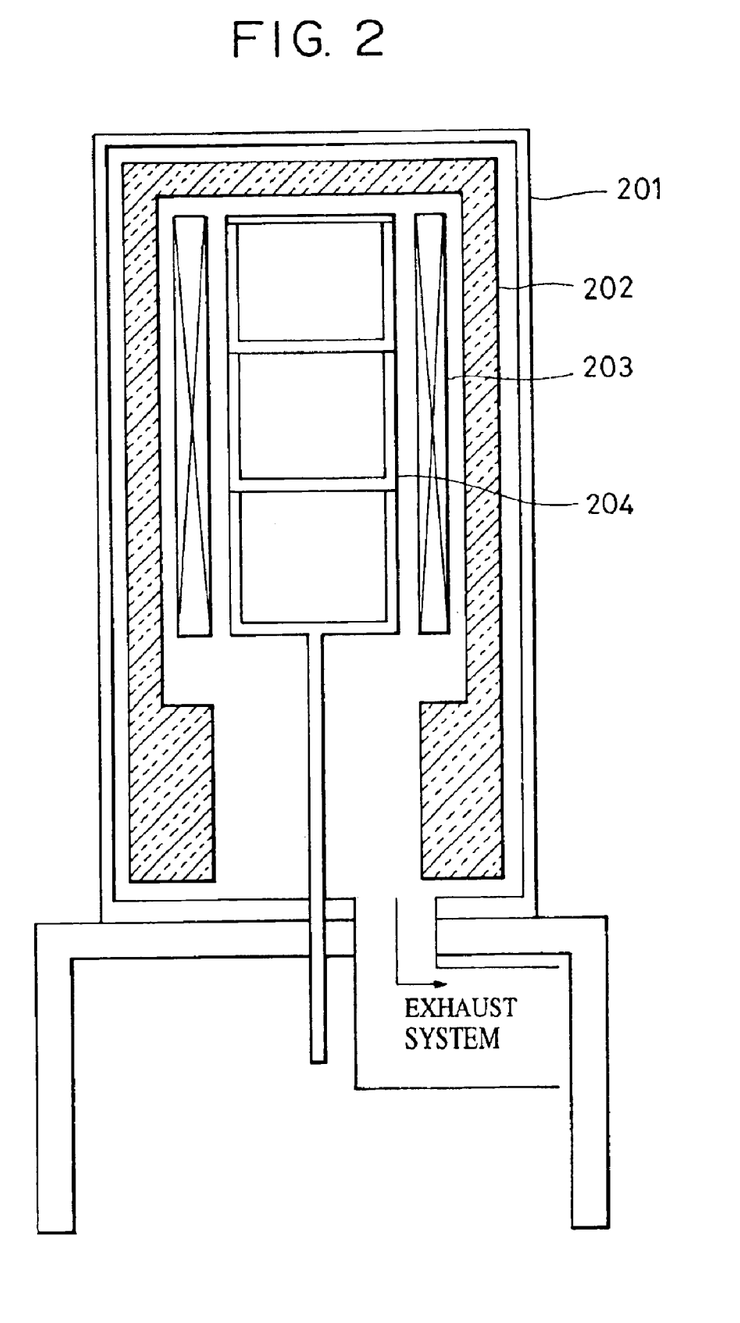
FIG. 2 is a schematic cross-sectional view showing an embodiment of a refining furnace preferably used in the present invention.

FIG. 2 shows a refining furnace of a large-aperture (having an aperture of 250 mm or more) production apparatus for a fluoride crystal according to the present invention. A crucible thereof is shown in FIG. 1 in detail. (The present invention of course is not limited to the production of a fluoride crystal with a 250 mm or more aperture.) Further, the present invention is also preferable for the production of an extremely large-aperture fluoride of about 500 mm aperture.

In FIG. 2, numeral 201 represents a chamber of the refining furnace, which is connected to a vacuum exhaust system. Numeral 202 represents an insulating material, 203 a heater, and 204 a crucible, respectively.

As shown in FIGS. 1A and 1B, the crucible for a refining furnace of the present invention is divided into a plurality of sections, and superimposed in multi-stages. Numeral 100 represents a crucible main body, and 101 a lid for preventing evaporation of a material, respectively. Although the number of stages shown in an embodiment in FIG. 1 is three, it can be two or four or more. The entire surface of the crucible main body 100 and the lid 101 has minute unevenness so that even when the lid 101 covers the crucible main body 100, the inside of the crucible main body 100 is not closed completely. Further, similarly, the adjacent crucibles have a minute gap between them, allowing the gas passage.

The size of the crucibles of each stage to be used in the present invention depends on the size of the fluoride crystal to be obtained. For example, since a crystal with about 250 mm to 500 mm aperture and about 10 mm to 100 mm thickness is needed in the case of a lens for an exposing device, a crucible with about 250 mm to 550 mm inner diameter and about 30 mm to 300 mm inner height is preferable. When a thin crystal is needed, the inner height can be 10 mm to 50 mm. When a crystal with a further smaller aperture is needed, the inner diameter can be smaller than 250 mm, for example, 80 mm to 100 mm.

In the present invention, the inner height of the crucible of each stage can be determined further preferably according to the state of the material such that the height of the molten material becomes 50 mm or less.

When the height of the molten material becomes 50 mm or less, impurities which easily remain inside the crystal, such as a metal element of a scavenger and oxygen, can efficiently be discharged to the outside so that the impurity concentration in the crystal can be further lowered.

Further, by having multi-stages, crystals with a preferable size can be obtained for the number of the stages at the same time so that the productivity can be improved. By having a size accommodated in a growth furnace crucible in the next process, since it can be placed in the growth furnace as it is so that a pulverization process is not needed, productivity can be improved.

The crucible shown in FIG. 1B has degassing holes 102 on the crucible side face in each stage. An impurity gas such as a scavenger can be discharged from the gap between the crucibles or the crucible and the lid in the configuration of FIG. 1A. With the configuration of FIG. 1B, the gas can be discharged mainly from the degassing holes 102. By providing these degassing holes 102, the discharge of the impurity gas is facilitated so that a crystal of a still higher purity can be obtained. The size of the degassing holes 102 is preferably 1 to 5 mm.

And it is preferable to provide the degassing holes symmetrically on the crucible side wall.

Hereinafter, a production apparatus of the present invention and a production method for a calcium fluoride crystal as a fluoride will be explained.

(Material Preparation)

As fluoride materials, fluorite ores and synthetic fluoride materials can be used. In the present invention, the latter can be used preferably.

(Mixing Process)

A calcium fluoride material and a scavenger are mixed. It is preferable to mix by placing the calcium fluoride material and the scavenger in a container and rotating the container. Examples of suitable scavengers include cadmium fluoride, lead fluoride, zinc fluoride, bismuth fluoride, sodium fluoride, and lithium fluoride. As the scavenger, those which bond with oxygen easily compared with the fluoride to be grown, can be eliminated by the reaction with an oxide contained in the synthetic fluoride material, can provide a high purity, and cannot influence optical characteristics even when a minute amount thereof remains, are selected. Among these examples, zinc fluoride and bismuth fluoride are particularly preferable.

The amount of a scavenger is preferably from 0.04 mol % to 5 mol %, more preferably from 0.1 to 1 mol %. The range is advantageous in that generated ZnO, and the like can be eliminated in a high temperature condition in each process, and that even when a minute amount thereof remains, optical characteristics can hardly be influenced.

(Refining Process)

The mixed fluoride material is placed in a multi-stage crucible having a desired size in each stage, melted, and crystalized.

The melting temperature can be a melting point of the fluoride or higher. Preferably it is 1390 to 1450° C.

A thermocouple made from platinum (not illustrated) was used for measuring the temperature. The crucible temperature was measured with the thermocouple in the vicinity of the outer wall of the crucible. Through detailed study performed by the present inventor, it was learned that a measured temperature in the range from 1380 to 1450° C. was preferable.

That is, with a temperature lower than 1380° C., the actual temperature in the crucible is low. If the temperature is close to the melting point, it takes a long time to completely melt the material, and thus the productivity cannot be improved. On the other hand, with a temperature higher than 1450° C., the fluoride material can be evaporated drastically, and a decline in the productivity by such material loss cannot be avoided.

With the height of a melting liquid in each stage of 50 mm or less, an added scavenger, the reaction product, and the other impurities can be discharged easily.

Crystallization is conducted by gradually cooling the molten fluoride. The fluoride to be obtained in this stage is not necessarily single-crystalline but can be polycrystalline. The surface layer of the obtained fluoride crystal is eliminated to a depth of 1 to 2 mm. It is also possible to conduct crystallization by cooling while lowering the crucible. In this case, the impurities can be eliminated still more effectively.

(Crystal Growth Process)

In the crystal growth process, a refined fluoride crystal is placed in a growth furnace crucible having a diameter larger than the refining crucible alone or in a plurality of such crucibles, superimposed on each other. It is preferable that the size (diameter) of the fluoride crystal obtained in the refining furnace crucible is 0.9 to 0.95 times as large as the size (diameter) of the growth furnace crucible. That is, it is preferable that the ratio of the size (diameter) of the fluoride obtained in the refining furnace and the size (diameter) of the growth furnace crucible is 1:1.05 to 1:1.1. As mentioned above, since the crucible surface has minute unevenness, the fluoride crystal can be taken out easily from the refining furnace crucible. Further, the taken-out fluoride crystal can be placed in the growth furnace crucible without pulverization.

In the crystal growth process, it is preferable to eliminate calcium oxide by introducing a scavenger into the growth furnace crucible with the fluoride crystal.

Figure 3:
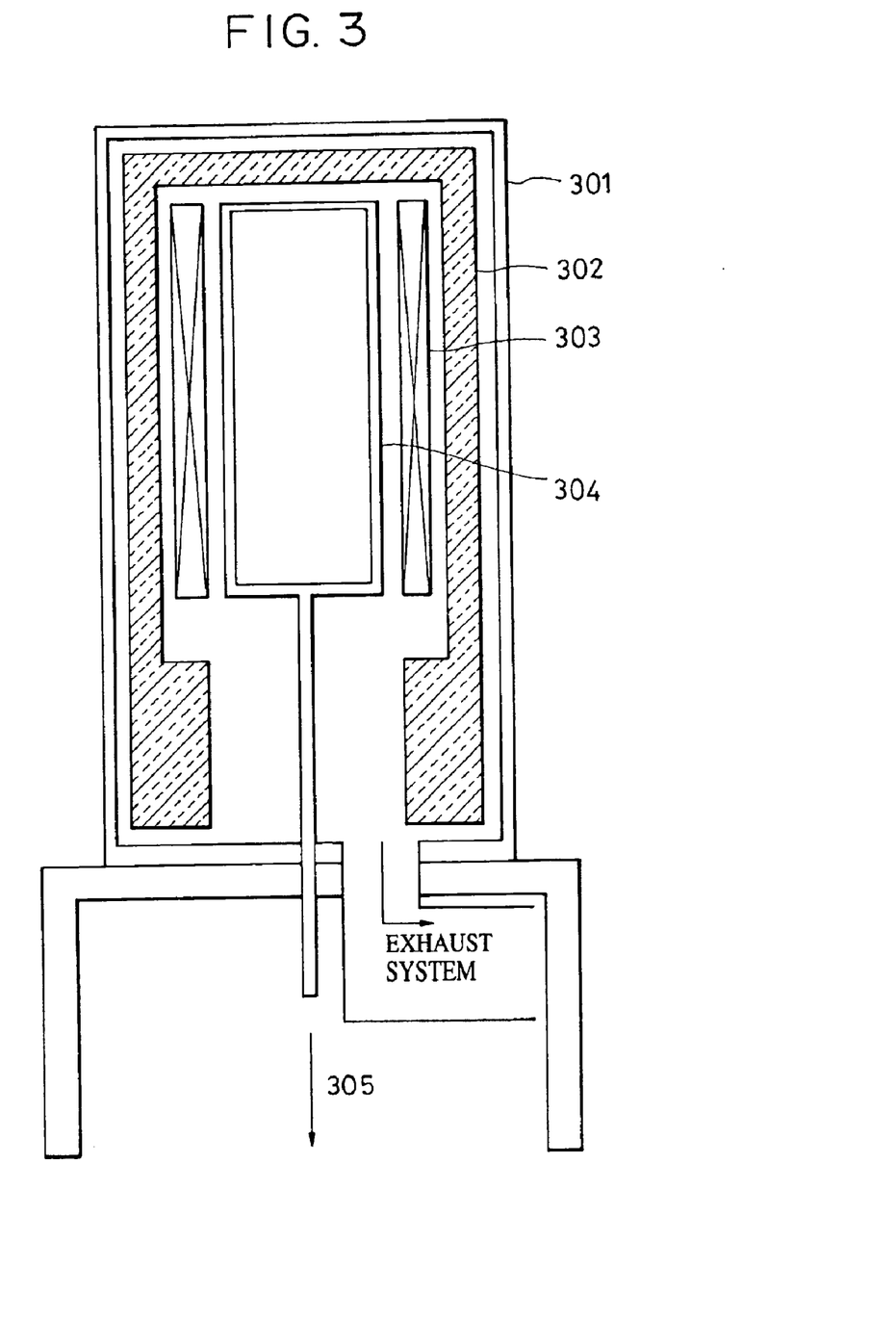
FIG. 3 is a schematic cross-sectional view showing an embodiment of a crystal growth furnace preferably used in the present invention.

FIG. 3 is a schematic diagram showing a growth furnace to be used in the crystal growth process. In FIG. 3, numeral 301 represents a chamber for the growth furnace, 302 an insulating material, 303 a heater, 304 a crucible, 305 a fluoride and 306 a crucible lowering mechanism.

Figure 4A:
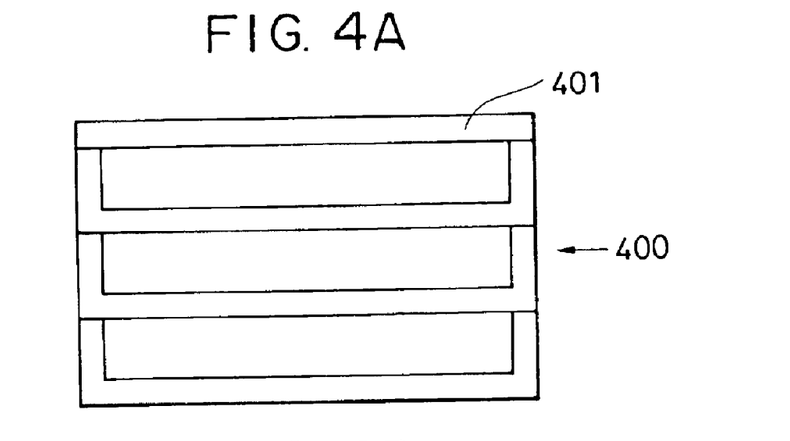
Figure 4B:
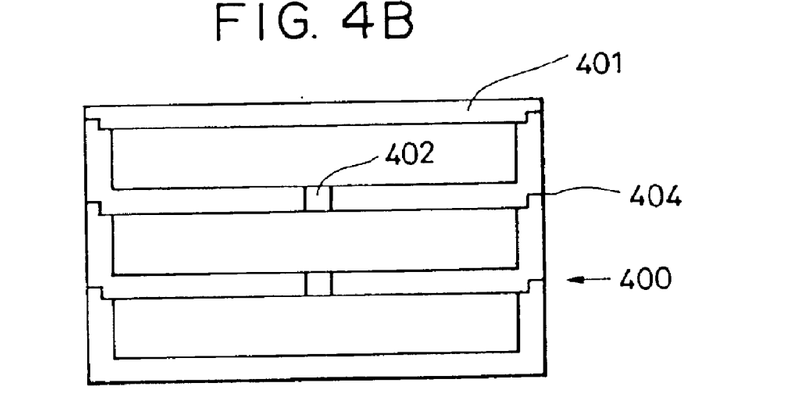
Figure 4C:
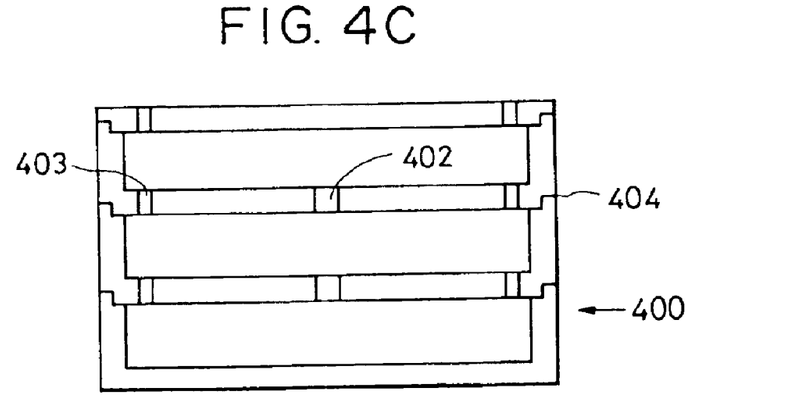

It is preferable that the growth furnace crucible is a multi-stage crucible like the refining furnace crucible as shown in FIG. 4 since the impurities in a material and a scavenger reaction product can be eliminated efficiently, so that impurities in the crystal that is finally obtained can be further limited, and a crystal with a high transmissivity can be obtained.

FIG. 4A shows a multi-stage crucible with the simplest configuration of the present invention.

In the present invention, it is preferable to determine the internal height of the crucible in each stage according to the state of the material such that the height of the crystal block to be produced becomes 10 mm to 50 mm. Since the height of the crystal block becomes the internal height of the crucible in the configuration of FIG. 4B or 4C having connecting holes 402, it is preferable that the internal height of the crucible is 10 mm to 50 mm. With a crucible (internal) height of not more than 50 mm, impurities which tend to remain inside a crystal, such as a metal element of a scavenger or oxygen, can be discharged efficiently to the outside so that the impurity concentration in the crystal can be further lowered. On the other hand, with a height of not less than 10 mm, a crystal with a still lower defect density can be obtained. That is, according to defect evaluation by etch pit density of a cleavage plane, defects are conspicuous in the vicinity of the crystal bottom face. In order to reduce this effect, it is preferable to have the internal height 10 mm or more.

Further, with the internal height of the crucible the same as the thickness of the optical part to be produced, a subsequent cutting process can be eliminated, to improve the productivity. The crucible internal height of each stage is not necessarily the same, but crucibles with different internal heights can be superimposed.

The crucible shown in FIG. 4B has a connecting hole 402 at the center part of the crucible bottom face in each stage. Through the hole, molten liquid drops to the next lower stage at the time of melting a material (that is, the stages communicate with each other). The size of the connecting holes 402 is preferably 1 to 5 mm diameter so that the molten liquid can drop to the next lower stage while overcoming surface tension.

The crystallization proceeds from the lowermost stage. The crystal of the connecting hole 402 serves as the seed to cause the crystal growth in the upper stages subsequently so as to provide a crystal with an excellent crystal quality.

Gas in the crucible can be discharged to the outside from the superimposed portions 404 of each stage. By selecting a material not wettable by the molten liquid (such as black lead) for the crucible, leakage of the molten liquid from the superimposed portions 404 can be prevented. However, since leakage is apt to occur in the lower stages due to the pressure with a large number of crucible stages, it is preferable to have a level difference in the superimposed portions 404 as shown in the figure.

The configuration of FIG. 4C is further provided with degassing holes 403 in the vicinity of the bottom face. By virtue of the degassing holes 403, an impurity gas can be discharged still more easily, so that a crystal with a higher purity can be obtained. The size of the degassing holes 403 is preferably smaller than the diameter of the above-mentioned connecting holes 402, and it is preferable to provide the degassing holes 403 symmetrically.

After heating the crucible to about 1390 to 1450° C. so as to melt the fluoride, the crucible is lowered at the rate of about 0.1 to 5.0 mm/h. Even though the crucible is not actively cooled, the temperature of a part of the fluoride is lowered according to the lowering movement of the crucible so as to be crystallized.

(Annealing Process)

The fluoride crystal after the crystal growth is applied with a heat treatment. In the annealing process, the crucible is heated to 900 to 1000° C. The heating time is preferably 20 hours or more.

Figure 5:
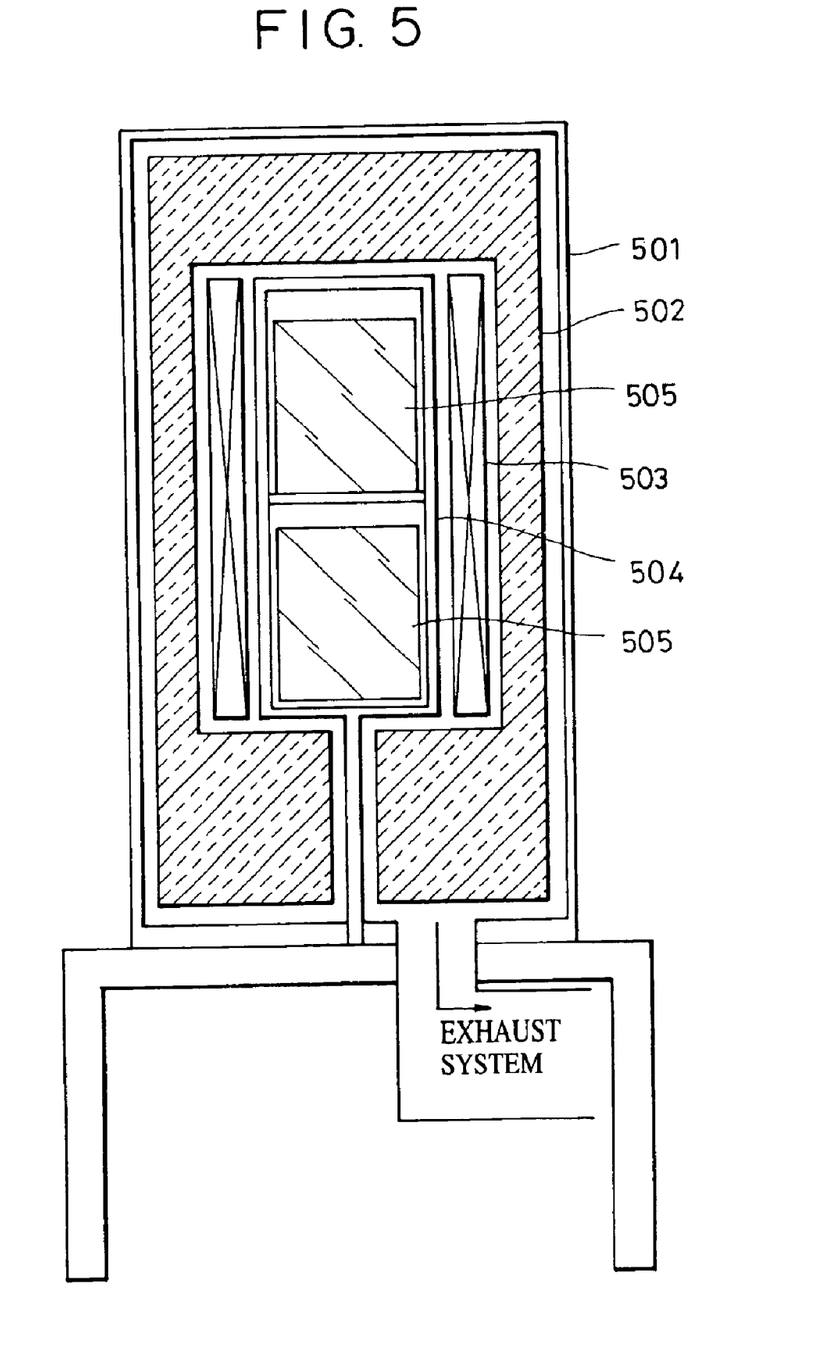
FIG. 5 is a schematic cross-sectional view showing an embodiment of an annealing furnace preferably used in the present invention.

FIG. 5 is a schematic diagram showing an annealing furnace to be used in the annealing process. In FIG. 5, numeral 501 represents a chamber of an annealing furnace, 502 an insulating material, 503 a heater, 504 a crucible and 505 a fluoride crystal.

(Processing)

The obtained product will be shaped according to the optical element to be provided (convex lens, concave lens, disk shape, plate shape, and the like). As needed, a reflection-preventing film can be provided on the surface of the optical material of the fluoride crystal. As such anti-reflection preventing film, magnesium fluoride, aluminum oxide, and tantalum oxide can be used preferably. These can be formed by deposition using resistance heating, electron beam deposition, or sputtering. Since an optical material obtained by the present invention contains hardly any water, the anti-reflection film can be attached with excellent adherence.

By combining various kinds of lenses thus obtained, an optical system appropriate for an excimer laser, and in particular, for an ArF excimer laser, can be provided. Furthermore, an exposing device can be provided by combining an excimer laser light source, an optical system having a lens made from calcium fluoride and a stage capable of moving a substrate.

Hereinafter, an exposing device using an optical material according to the prevent invention will be explained.

Examples of exposing devices include a reduction projection exposing device and a lens type equivalent magnification projection exposing device.

In particular, in order to expose the entire surface of a wafer, a stepper applied with a step and repeat method, where after exposing one small section (field) of the wafer, an adjacent one field is exposed by moving the wafer by one step, is preferable. Of course it can also be used to advantage in an exposing device with a micro-scan method.

Figure 8:
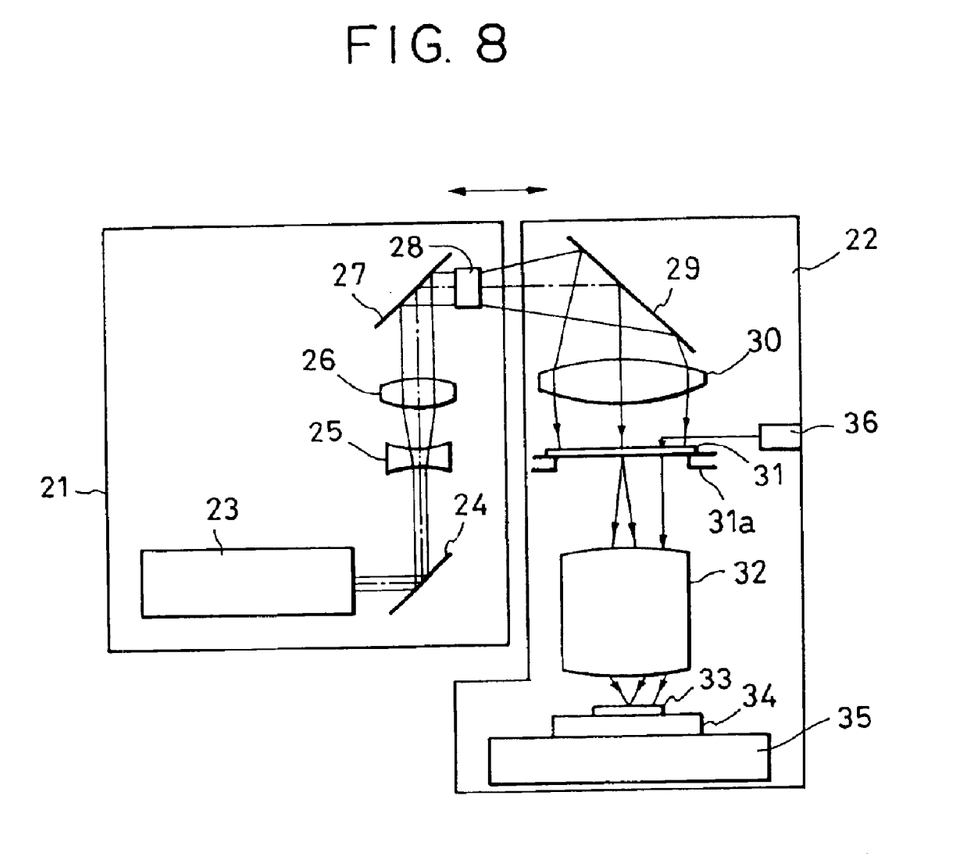
FIG. 8 is a schematic diagram of an exposed device that includes optical parts made according to the present invention.

FIG. 8 shows a schematic configuration of an exposing device of the present invention. In FIG. 8, numeral 21 represents a illumination light source portion and 22 an exposing mechanism portion, which are provided independently. (That is, they are physically separated.) Numeral 23 represents an illumination light source, such as a high output large light source like an excimer laser. Numeral 24 represents a mirror, 25 a concave lens, and 26 a convex lens, respectively. 25 to 26 also serve as a beam expander for expanding the beam diameter of a laser to about a size of an optical integrator. Numeral 27 represents a mirror, and 28 an optical integrator for evenly illuminating a recticle. The illumination light source portion 21 comprises the illustrated elements from the laser 23 to the optical integrator 28. Numeral 29 represents a mirror and 30 a condenser lens for collimating a light flux outputted from the optical integrator. Numeral 31 represents a reticle with a circuit pattern formed whereon, 31*a* a reticle holder for holding the reticle, 32 a projection optical system for projecting the reticle pattern, and 33 a wafer where the reticle 31 pattern is printed at the projecting lens 32. Numeral 34 represents an XY stage for holding the wafer 33 and moving in the XY directions at the time of printing. Numeral 35 represents a fixed table of the exposing device.

The exposing mechanism portion 22 comprises the illustrated elements from the mirror 29 to the fixed table 35, which are a part of the illumination optical system. Numeral 36 represents an alignment means to be used for the TTL alignment. In general, an exposing device further comprises an auto focus mechanism, a wafer conveyance mechanism, and the like. These are also included in the exposing mechanism portion 22.

Figure 9:
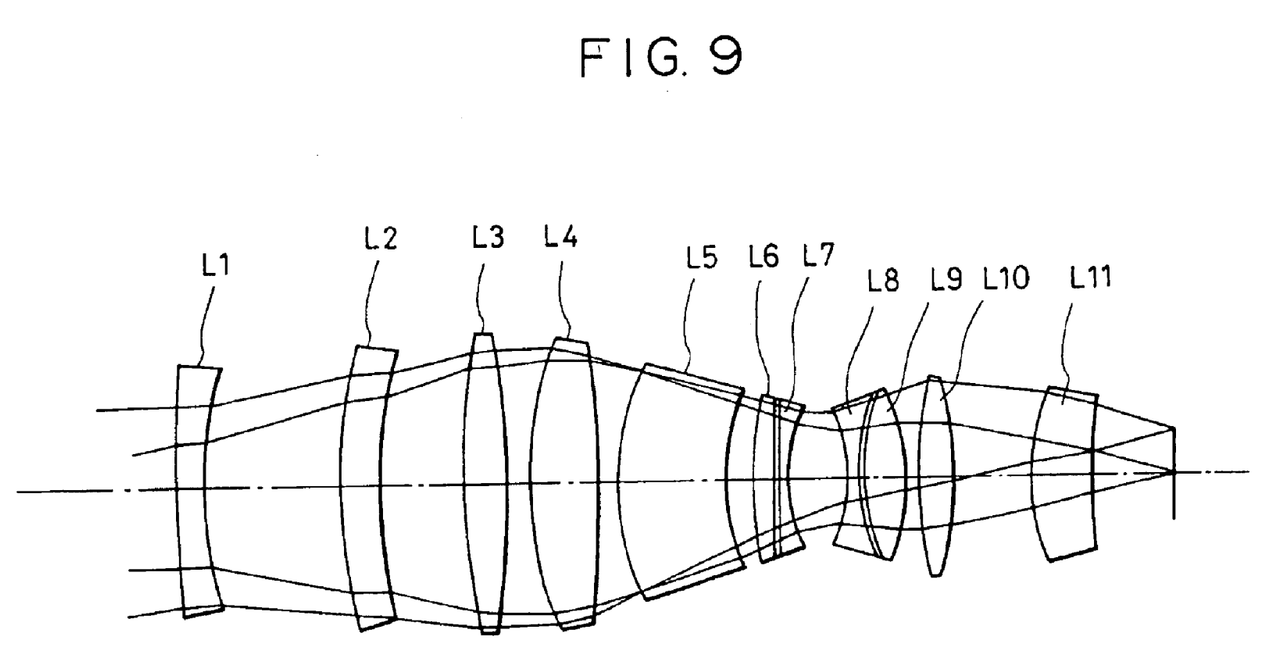
FIG. 9 is a projection optical system of an exposing device using optical parts made according to the present invention.

FIG. 9 shows an example of an optical material to be used in an exposing device of the present invention, which can be used in the projection optical system of the exposing device shown in FIG. 8. The lens assembly comprises 11 lenses L1 to L11, which are not bonded to each other. An optical material made of a fluorite of the present invention can be used as a lens or a mirror shown in FIG. 9 or 10, or a mirror or a lens of a mirror type exposing device (not illustrated). It is more preferable to provide an anti-reflection film or an amplifying reflection film on the surface of such a lens or mirror.

Furthermore, an optical part made from a fluoride crystal of the present invention can be used as a prism or an etalon.

Figure 10A:
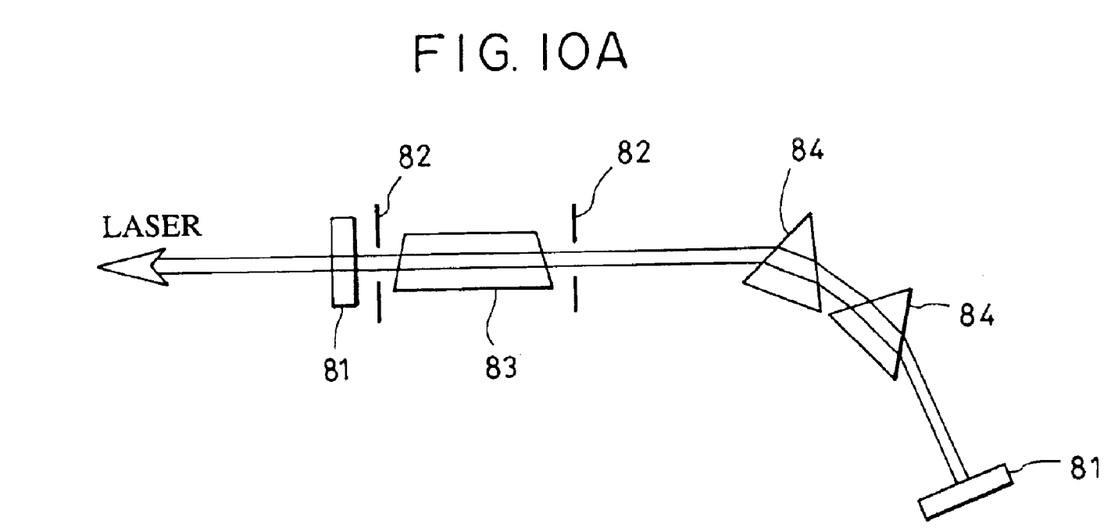
Figure 10B:
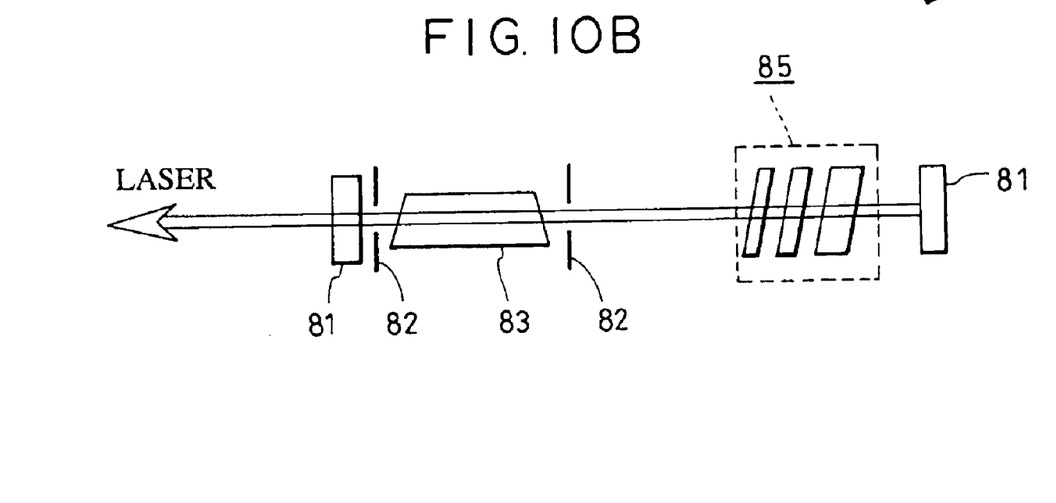

FIGS. 10A and 10B are schematic diagrams of a configuration of an excimer laser oscillator using an optical part made of a fluoride crystal of the present invention.

The excimer laser oscillator shown in FIG. 10A comprises a resonator 83 for emitting and resonating an excimer laser beam, an hole 82 for adjusting the excimer laser beam outputted from the resonator 83, a prism 84 for narrowing the bandwidth of the excimer laser light, and a reflecting mirror 81 for reflecting the excimer laser light.

The excimer laser oscillator shown in FIG. 10B comprises a resonator 83 for emitting and resonating excimer laser light, an hole 82 for adjusting the excimer laser light outputted from the resonator 83, an etalon for ensuring that the excimer laser consists of a single wavelength, and a reflection mirror for reflecting the excimer laser light.

An excimer laser beam oscillator comprising a fluoride crystal of the present invention as a prism or an etalon can have a smaller excimer laser wavelength via the prism or the etalon (in other words, can have the output limited to a single wavelength).

By radiating an excimer laser beam onto a photosensitized resist on a substrate via a reticle pattern with the exposing device, a latent image corresponding to the pattern to be formed can be provided.

EXAMPLE

A production apparatus of a fluoride crystal of the present invention will be explained concretely with reference to examples.

Example 1

Figure 6:
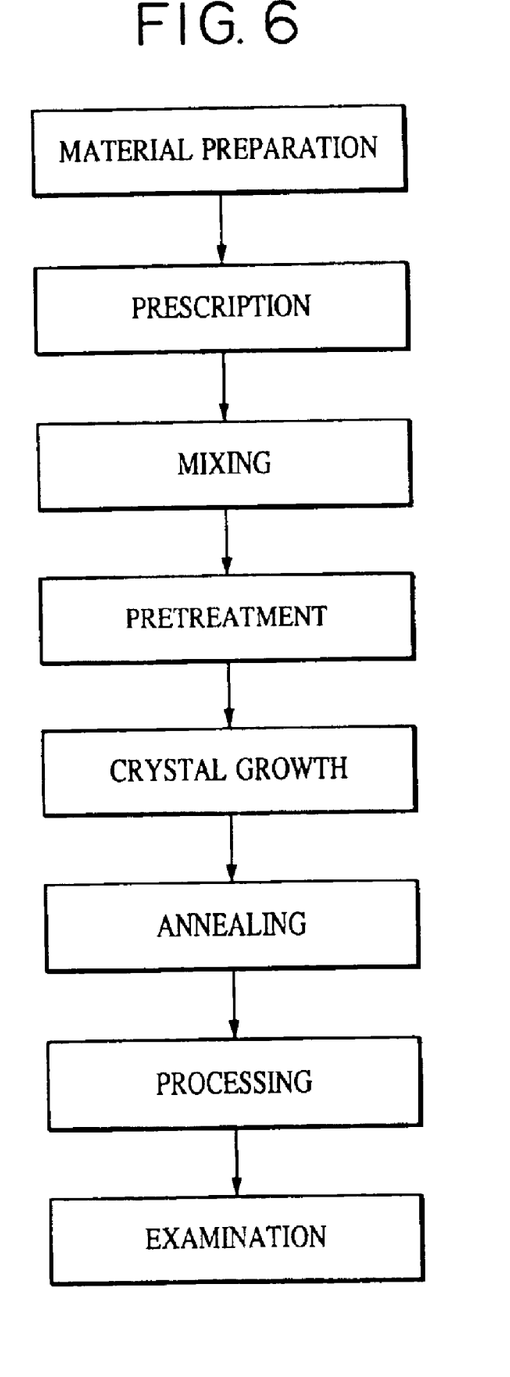
FIG. 6 is a flow chart of a crystal production process preferably used in the present invention.

In this example, a calcium fluoride crystal was produced according to a procedure shown in FIG. 6. Hereinafter each process will be explained.

(Prescription, Mixing Process)

A powdery calcium fluoride material was placed in a container. 0.08 mol % of a scavenger ($ZnF_2$) was measured based on the material, and added to the container with the material. The container used has a capacity about double the volume of the material. The material and the scavenger were mixed by rotating the container for about 1 hour.

(Refining Process)

The material was refined with a refining furnace shown in FIG. 2.

A multi-stage crucible shown in FIG. 1A with three stages was used.

After filling the prepared material in each stage of the crucible, the crucible was set in the refining furnace. By vacuum-exhausting the inside of the chamber 201, the moisture in the material 205 was eliminated.

While maintaining the vacuum degree at $5 \times 10^{-4}$ Torr or less until the temperature where the material starts melting, the crucible 204 was heated by the heater 203. The material was melted at 1390 to 1450° C. The material in the crucible was completely melted.

After reaching the melting temperature, the crucible was maintained until the vacuum degree became $2 \times 10^{-6}$ Torr or less.

Then, the crucible was cooled down, by turning off the power of the heater, to about the room temperature. The fluoride crystals were taken out from each stage and the surface layer thereof was eliminated a depth of about 1 mm.

(Crystal Growth Process)

Then the crystal growth of the calcium fluoride was conducted with the growth furnace shown in FIG. 3.

$ZnF_2$ was placed in the crucible 304 as the scavenger. Further, a plurality of the refined crystal blocks were placed in each crucible stage in a superimposed stage. Then, the crucible was set in the growth furnace. The amount of the $ZnF_2$ scavenger was 0.02 mol % with respect to the refined crystal blocks.

The inside of the chamber 301 was vacuum-exhausted to eliminate the moisture in the crystals 305. Then the crucible was heated by the heater 303 while maintaining the vacuum degree at $5 \times 10^{-4}$ Torr or less until the temperature where the material starts melting. The material was melted at 1390 to 1450° C. The material in the crucible was completely melted.

After reaching the melting temperature, the crucible was maintained until the vacuum degree became $2 \times 10^{-6}$ Torr or less. Further, the crucible was maintained for about 10 hours after the temperature reached a stable state.

The crucible was moved downward by the lowering mechanism 306 at about 2 mm/hour. When the crucible was completely lowered, the voltage applied to the heater 303 was gradually reduced such that the temperature lowering rate fell to below about 100° C./hour.

The power of the heater was switched off to cool down to about room temperature. The calcium fluoride crystal (50 mm thickness) was taken out from the furnace.

(Annealing Process)

With the annealing furnace shown in FIG. 5, the calcium fluoride crystal was heat-treated. The taken-out crystal was set in the annealing crucible 504. About 0.04 mol % of $ZnF_2$ with respect to the crystal was sprinkled substantially evenly as a scavenger between the crystal and the crucible. The inside of the chamber 501 was vacuum-exhausted and gradually heated. The temperature schedule was as mentioned below.

Room temperature→900° C. (rising rate+100° C./h)

Maintain at 900° C. (20 hours)

900° C.→room temperature (lowering rate→6° C./h)

After cooling to about the room temperature, the crystal was taken out from the furnace.

The crystal accordingly produced was cut in a 10 mm thickness was taken out from the furnace.

The crystal accordingly produced was cut in a 10 mm thickness and abraded.

Example 2

In this embodiment, a fluoride crystal was produced using the same process as Example 1 except that the crucible shown in FIG. 1B was used instead of the crucible of the refining furnace of Example 1. The degassing holes with a 3 mm diameter were provided at 8 positions symmetrically.

Example 3

In this embodiment, a fluoride crystal was produced using the same process the same as Example 1 except that the multi-stage crucible with the configuration of FIG. 4B was used as the growth furnace crucible.

Example 4

In this embodiment, a fluoride crystal was produced using the same process as Example 2 except that a crucible having substantially the same configuration as the crucible shown in FIG. 4B was used.

Conventional Example

In order to evaluate the performances of the fluoride crystals obtained in Examples 1 to 4, a calcium fluoride crystal was produced as the comparative example in the process the same as Example 1 except that a block produced in the conventional production process explained with reference to FIG. 11 excluding the process for eliminating an impurity gas was pulverized and used as the material.

Figure 7:
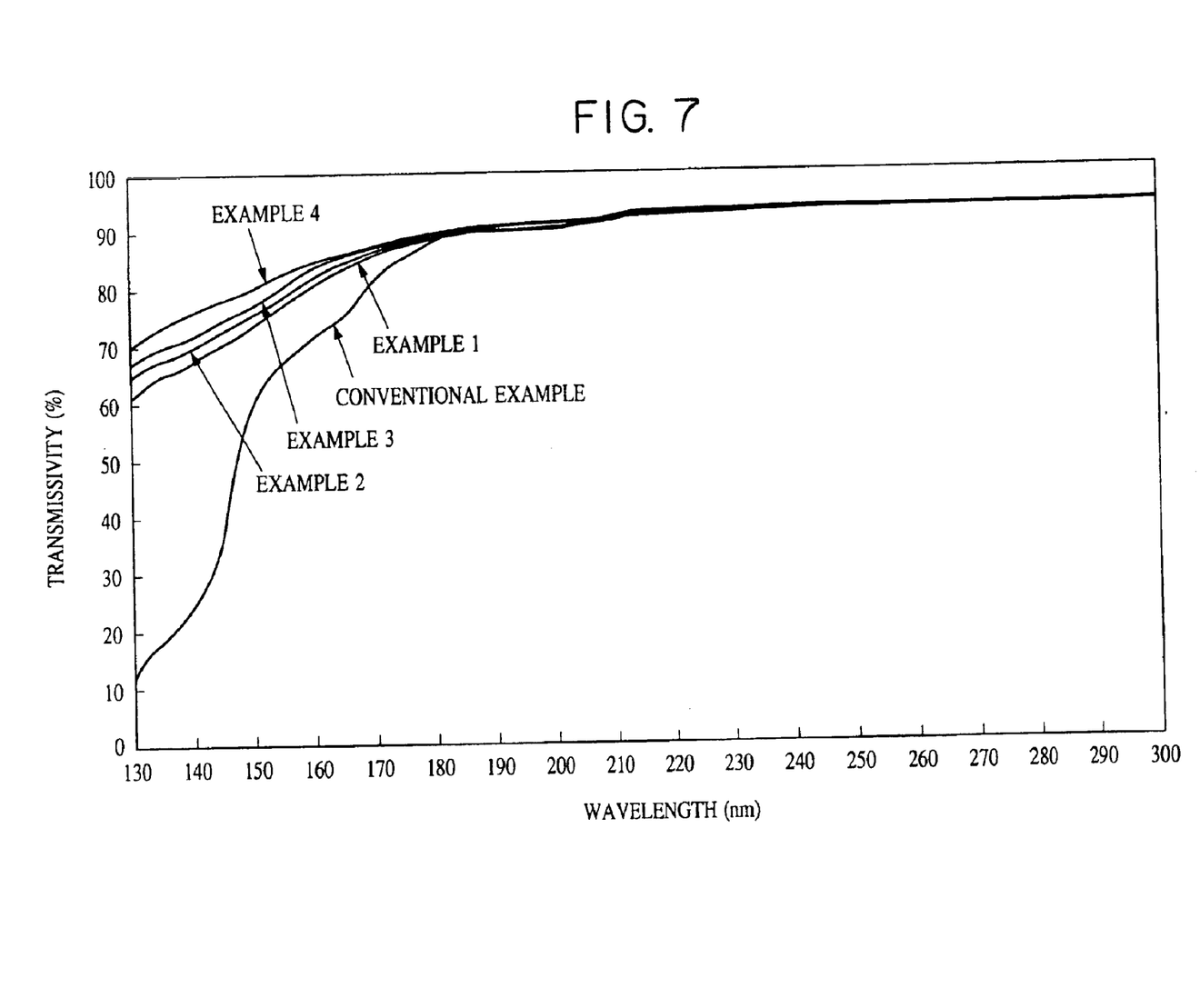
FIG. 7 shows a spectral transmissivity of a fluorite.

The spectral transmissivity of the fluorites produced in Examples 1 to 4 and the foregoing Conventional Example are shown in FIG. 7.

As apparent from the comparison between Example 1 the Conventional Example, by using a multi-stage crucible having a gap to allow the passage of a gas between crucibles for the refining furnace, the transmissivity of the crystal finally obtained becomes higher in the short wavelength region. It was also learned that the spectral transmissivity can be further improved in Example 2 where degassing holes are provided in the crucible side face for the refining furnace.

Furthermore, it was learned that the spectral transmissivity can be still higher in Examples 3 and 4 with a multi-stage crucible for the growth furnace, as compared with the corresponding Examples 1 and 2.

As mentioned above, according to the present invention, since a scavenger and the other impurity gases can be eliminated efficiently from the crystal, a fluoride crystal with a high transmissivity can be obtained.

Accordingly, even when a short wavelength light beam of a high output is radiated repeatedly over a long period, a highly reliable fluoride crystal without the risk of deteriorating the transmissivity characteristics can be provided.

Furthermore, according to the present invention, since the refined crystal can be placed in the growth furnace as it is, the productivity can be improved so that an optical material can be produced at a low cost.

What is claimed is:

1. A production apparatus for producing a crystal, said apparatus comprising:
    a crucible divided into a plurality of stages, each stage containing a crystal precursor material; and
    a heater arranged to heat said crucible,
    wherein each stage of said plurality of stages of said crucible has formed therein a degassing hole in a side wall portion thereof for discharging an impurity gas produced when refining the crystal precursor material by adding a scavenger thereto, and
    wherein a lower portion of a first stage of the plurality of stages is positioned to cover an upper edge of a wall portion of a second stage of the plurality of stages, an inner height of each stage of said plurality of stages is 10 mm to 50 mm, the degassing hole has a diameter of 1 mm to 5 mm, and a fluoride crystal is formed from the precursor material.

2. A production apparatus according to claim 1, wherein the plurality of stages is used in a sequential manner.

3. A production apparatus according to claim 1, wherein each stage of said plurality of stages of said crucible has formed therein at least two degassing holes in the wall portion thereof.

4. A production apparatus according to claim 1, wherein each stage of said plurality of stages of said crucible has formed therein a connecting hole at a bottom center portion thereof.

5. A production apparatus according to claim 1, wherein said crucible has a cylindrical shape.

6. A production apparatus according to claim 1, wherein said crucible has an inner diameter of at least 250 mm.

7. A production apparatus according to claim 1, wherein said crucible has a region for mounting a material.

8. A production apparatus according to claim 1, comprising:
    a region for receiving a material, said region formed by superimposing a plurality of crucibles; and
    wherein the crucible has no connecting hole at the lowermost stage.

9. A production apparatus for producing a crystal, said apparatus comprising:
    a crucible containing a crystal precursor material; and
    a heater arranged to heat said crucible,
    wherein said crucible is divided into a plurality of stages and each of said plurality of stages of said crucible has formed therein a degassing hole in a side wall portion thereof for discharging an impurity gas produced when refining the crystal precursor material by adding a scavenger thereto, and
    wherein a fluoride crystal is formed from the crystal precursor material.

10. A production appartus according to claim 9, wherein said crucible has formed therein at least two degassing holes in the side wall portion thereof.

11. A production apparatus according to claim 9, wherein said crucible has a cylindrical shape.

12. A production apparatus according to claim 9, wherein said crucible has an inner diameter of at least 250 mm.

13. A production apparatus according to claim 9, wherein said degassing hole has a diameter of 1 to 5 mm.

14. A production apparatus according to claim 9, wherein said crystal comprises calcium fluoride and said scavenger comprises at least one of cadmium fluoride, lead fluoride, zinc fluoride, bismuth fluoride, sodium fluoride and lithium fluoride.

15. A crystal production method for producing a crystal using the production apparatus according to claim 9.

16. A crystal production method according to claim 15, wherein the crystal is used as an optical element.

* * * * *

UNITED STATES PATENT AND TRADEMARK OFFICE
CERTIFICATE OF CORRECTION

PATENT NO. : 6,875,275 B1  
APPLICATION NO. : 09/048795  
DATED : April 5, 2005  
INVENTOR(S) : Toshio Ichizaki It is certified that error appears in the above-identified patent and that said Letters Patent is hereby corrected as shown below:

TITLE PAGE AT (*) Notice:

Insert:
        --This patent issued on a continued prosecution application filed under 37 CFR 1.53(d), and is subject to the twenty tear patent term provisions of 35 U.S.C. 154(a)(2).--.

TITLE PAGE AT (30) FOREIGN APPLICATION PRIORITY DATA

"9/081624" should read --9-81624--.

"10/063952" should read --10-63952--.

TITLE PAGE AT (56) FOREIGN PATENT DOCUMENTS

Line 1, "4349198    12/1992" should be deleted.

Line 3, "4349199    12/1992" should be deleted.

TITLE PAGE AT (56) OTHER PUBLICATIONS

Delete:
    "V.N. Cheredov, "Contaminant Color Centers in Synthetic Crystals of Calcium Fluoride", Inorganic Material, vol. 28, No. 3, 1992 (Russian Pulication).*"

COLUMN 1

Line 24, "exciser" should read --excimer--.

Line 29, "molecules-capable" should read --molecules capable--.

Line 51, "gasettes" should read --gazettes--.

COLUMN 3

Line 65, "10B" should read --10B,--.

Line 67, "present." should read --present invention.--.

UNITED STATES PATENT AND TRADEMARK OFFICE
CERTIFICATE OF CORRECTION

| | |
|---|---|
| PATENT NO. | : 6,875,275 B1 |
| APPLICATION NO. | : 09/048795 |
| DATED | : April 5, 2005 |
| INVENTOR(S) | : Toshio Ichizaki |

It is certified that error appears in the above-identified patent and that said Letters Patent is hereby corrected as shown below:

COLUMN 4

Line 29, "the" should be deleted.

COLUMN 6

Line 20, "as" should be deleted.

COLUMN 7

Line 37, "preventing" should be deleted.

Line 64, "a" should read --an--.

COLUMN 8

Line 12, "whereon," should read --thereon,--.

Line 25, "auto focus" should read --autofocus--.

Line 54, "an" should be deleted.

Signed and Sealed this

Third Day of April, 2007

JON W. DUDAS
*Director of the United States Patent and Trademark Office*